US00RE40749E

(19) United States
(12) Reissued Patent
Fogg

(10) Patent Number: US RE40,749 E
(45) Date of Reissued Patent: Jun. 16, 2009

(54) CABLE ASSEMBLY WITH EQUALIZER BOARD

(75) Inventor: Michael W. Fogg, Harrisburg, PA (US)

(73) Assignee: The Whitaker Corporation, Wilmington, DE (US)

(21) Appl. No.: 10/159,939

(22) Filed: May 31, 2002

Related U.S. Patent Documents

Reissue of:
(64) Patent No.: 5,766,027
Issued: Jun. 16, 1998
Appl. No.: 08/658,111
Filed: Jun. 4, 1996

U.S. Applications:
(63) Continuation of application No. 09/598,775, filed on Jun. 16, 2000, now Pat. No. Re. 37,893.
(60) Provisional application No. 60/009,488, filed on Dec. 21, 1995.

(51) Int. Cl.
*H01R 9/09* (2006.01)

(52) U.S. Cl. ..... 439/76.1
(58) Field of Classification Search ..... 437/76.1, 437/77, 493, 497, 499
See application file for complete search history.

(56) References Cited

U.S. PATENT DOCUMENTS

| | | | | |
|---|---|---|---|---|
| 3,737,833 | A | | 6/1973 | Jerominek |
| 3,951,492 | A | | 4/1976 | Braund |
| 4,023,879 | A | | 5/1977 | Braund et al. |
| 4,157,612 | A | | 6/1979 | Rainal |
| 4,389,080 | A | * | 6/1983 | Clark et al. ..... 439/62 |
| 4,527,285 | A | | 7/1985 | Kekas et al. |
| 4,616,895 | A | * | 10/1986 | Yoshizaki et al. ..... 439/330 |
| 4,717,218 | A | | 1/1988 | Ratcliff |
| 4,720,630 | A | | 1/1988 | Takeuchi et al. |
| 4,821,150 | A | * | 4/1989 | Duthie et al. ..... 361/736 |
| 4,889,497 | A | * | 12/1989 | Riches ..... 439/76.1 |
| 4,935,284 | A | | 6/1990 | Puerner |
| 4,936,792 | A | | 6/1990 | Onoue et al. |
| 5,133,668 | A | | 7/1992 | Brown, IV |
| 5,358,426 | A | | 10/1994 | Henschen et al. |
| 5,380,223 | A | | 1/1995 | Marsh et al. |
| 5,387,131 | A | | 2/1995 | Foreman et al. |
| 5,435,757 | A | | 7/1995 | Fedder et al. |
| 5,507,668 | A | | 4/1996 | Lambrinos et al. |
| 5,580,271 | A | | 12/1996 | Buchheister, Jr. et al. |
| 5,955,703 | A | | 9/1999 | Daly et al. |

FOREIGN PATENT DOCUMENTS

| | | |
|---|---|---|
| DE | 91 12 427.1 | 2/1992 |
| DE | 94 01 974.6 | 4/1994 |
| DE | 42 16 262 C2 | 1/1998 |
| JP | 227076 | 7/1994 |
| JP | 231126 | 9/1994 |

* cited by examiner

*Primary Examiner*—Neil Abrams

(57) ABSTRACT

An electrical cable assembly 1 comprising: a housing 2, electrical contacts 3 in the housing 2 connected to a circuit board 4, multiple conductors 5 of an electrical cable 6 connected to the circuit board 4, signal conditioning circuitry 7 on the circuit board 4, the circuitry 7 being interposed between the electrical contacts 3 and the conductors 5, and an insulating holder 8 mounted on the circuit board 4, the contacts 3 extending on the holder 8, and the holder 8 being mounted in a cavity in the housing 2.

25 Claims, 7 Drawing Sheets

Fig. 16
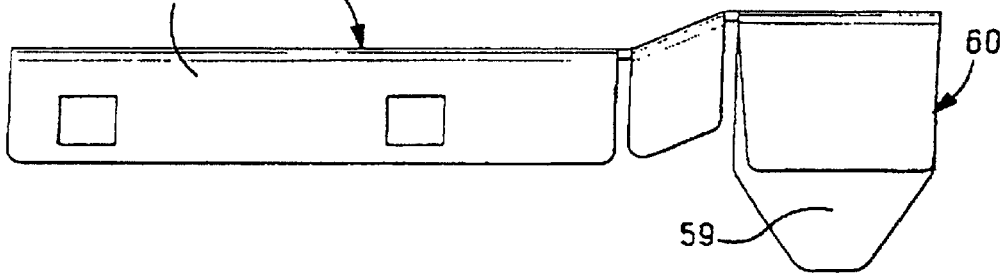
Fig. 17
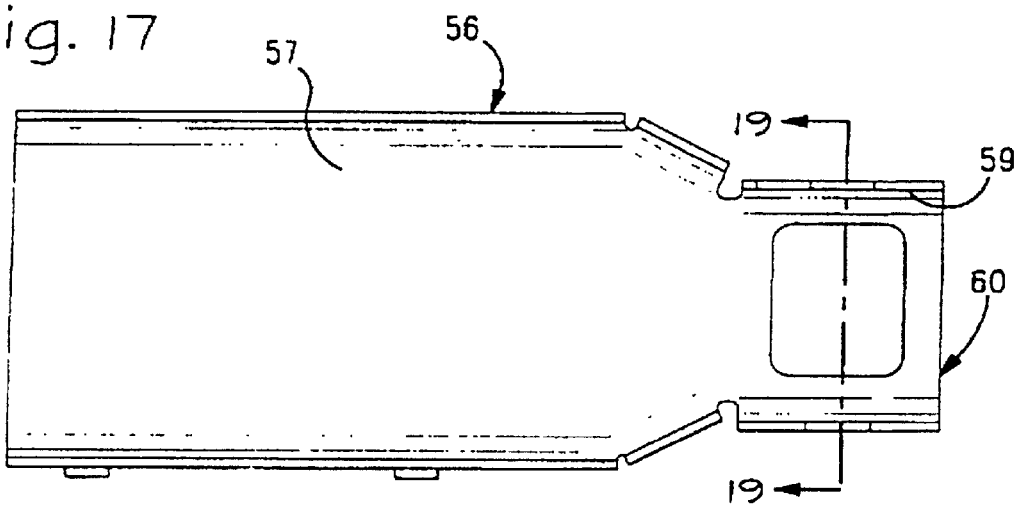
Fig. 18
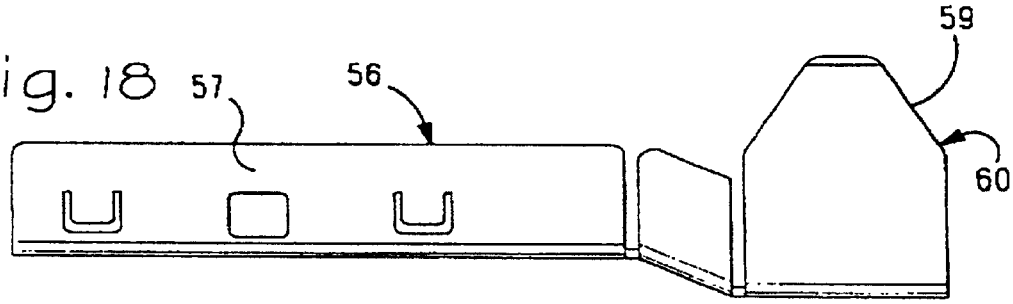
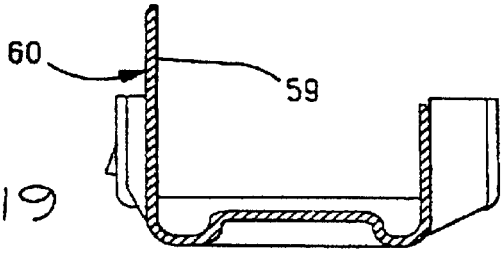
Fig. 19

CABLE ASSEMBLY WITH EQUALIZER BOARD

Matter enclosed in heavy brackets [ ] appears in the original patent but forms no part of this reissue specification; matter printed in italics indicates the additions made by reissue.

This application claims the benefit of U.S. Provisional Application Ser. No. 60/009,488, filed Dec. 21, 1995 *and this application is a continuation of Reissue Patent RE* 37,893, filed Jun. 16, 2000 and issued on Oct. 22, 2002, the subject matter of each of which is herein incorporated by reference in their entirety.

FIELD OF THE INVENTION

The present invention relates to an electrical cable assembly, and more particularly, to an electrical cable assembly in which signal conditioning circuit elements terminate multiple electrical cable conductors.

BACKGROUND OF THE INVENTION

An electrical cable assembly as disclosed in U.S. Pat. Nos. 5,358,426 and 4,023,879, comprises, an electrical cable with multiple electrical conductors, and a housing attached to the cable, and electrical contacts in the housing. For a cable assembly without signal conditioning circuit elements, the electrical contacts connect directly to respective cable conductors. For a cable assembly with signal conditioning circuit elements, such as resistors, capacitors and inductors, the circuit elements are mounted in the housing, and are connected with electrical contacts in the housing. When the circuit elements are individual, or discrete, circuit elements, each must be individually mounted in the housing, and individually connected to electrical contacts. Time is expended to incorporate individual circuit elements into the cable assembly. Further time is expended to connect individual circuit elements with cable conductors and electrical contacts.

A problem to be solved is to improve the manner in which signal conditioning circuit elements are incorporated into a housing and connected to electrical contacts and multiple cable conductors.

SUMMARY OF THE INVENTION

According to the invention, a cable assembly incorporates a circuit board with signal conditioning circuitry. The signal conditioning circuitry on a circuit board replaces individual circuit elements. The circuit board is a feature that reduces the time required to incorporate signal conditioning circuit elements with the cable assembly, and reduces the time required for connection of the circuit elements with the electrical contacts and with the cable conductors. Circuit elements that provide signal conditioning can be mounted on the circuit board, and circuitry on the circuit board can be aligned with and joined with electrical contacts and cable conductors. The electrical contacts are connected to the circuit board, and multiple conductors of an electrical cable are connected to the circuit board. Thus, a feature of the invention resides in a circuit board to incorporate signal conditioning circuitry in a cable assembly.

An advantage of the invention resides in a cable assembly having a housing that is constructed for alignment of a circuit board relative to electrical contacts and multiple cable conductors, which improves the time expended for performing connection of signal conditioning circuitry with the contacts and the cable conductors.

DESCRIPTION OF THE DRAWINGS

An embodiment of the invention will now be described, by way of example, with reference to the accompanying drawings, according to which:

FIG. 16 is a side view of a conducting shell comprising a portion of an electrical shield;

FIG. 17 is a top view of the shell as shown in FIG. 16;

FIG. 18 is a side view of the shell as shown in FIG. 17;

FIG. 19 is a section view of a channel portion of the shell as shown in FIG. 18;

DETAILED DESCRIPTION

Figure 1:
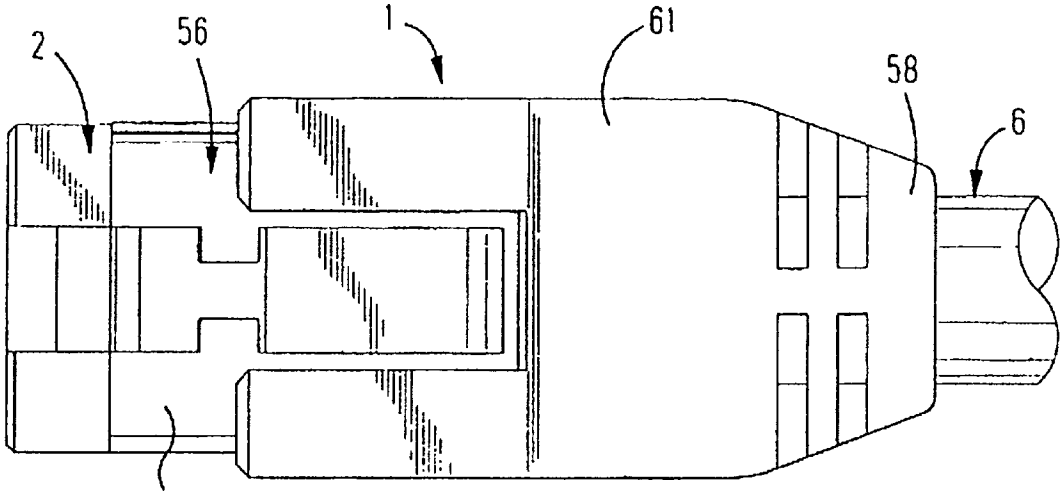
FIG. 1 is a top view of a cable assembly.
Figure 2:
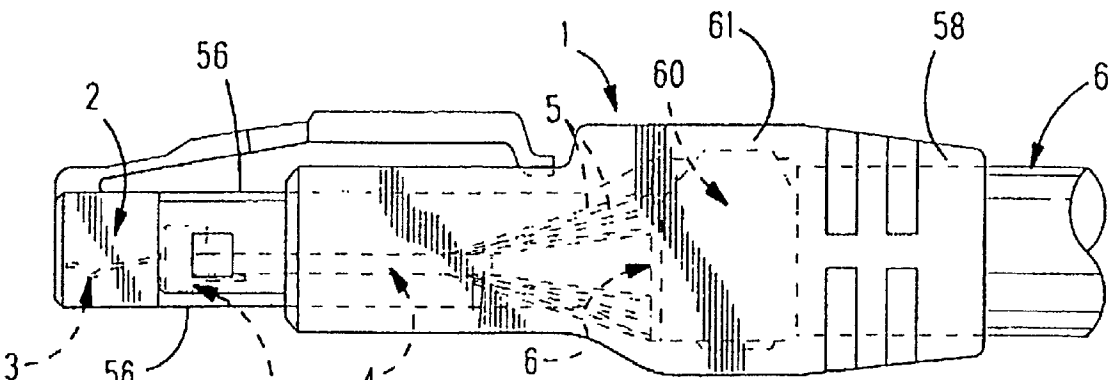
FIG. 2 is a side view of the cable assembly shown in FIG. 2.
Figure 3:
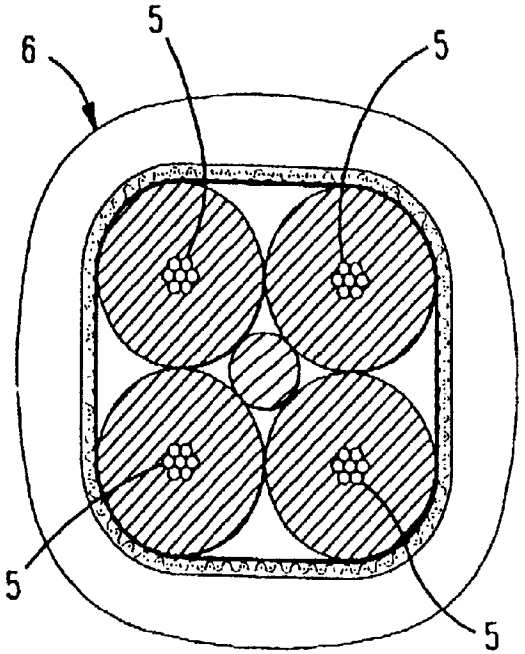
FIG. 3 is a section view of an electrical cable.

With reference to the FIGS. 1–3 an electrical cable assembly 1 comprises, a housing 2, electrical contacts 3 (see FIGS. 13–15) in the housing 2 connected to a circuit board 4, multiple conductors 5 of an electrical cable 6 connected to the circuit board 4, signal conditioning circuitry 7 on the circuit board 4, the circuitry 7 being interposed between the electrical contacts 3 and the conductors 5, and an insulating holder 8 (see FIGS. 9–12) mounted on the circuit board 4, the contacts 3 extending on the holder 8, and the holder 8 being mounted in a cavity 43 in the housing 2.

Figure 20:
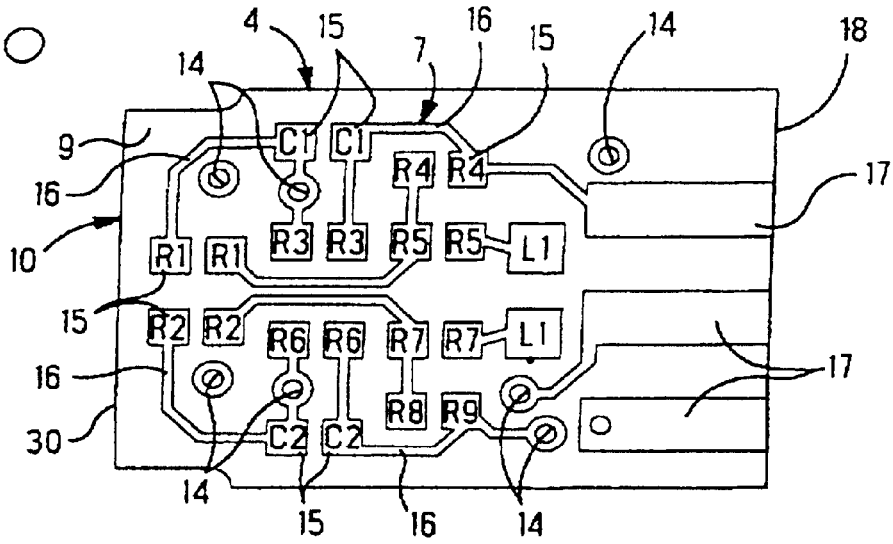
FIG. 20 is a top view of a top layer of a circuit board.
Figure 21:
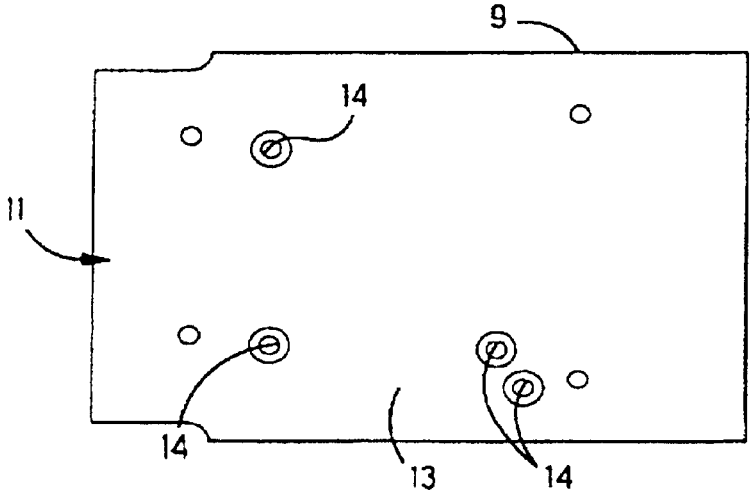
FIG. 21 is a top view of a middle layer of the circuit board as shown in FIG. 20.
Figure 22:
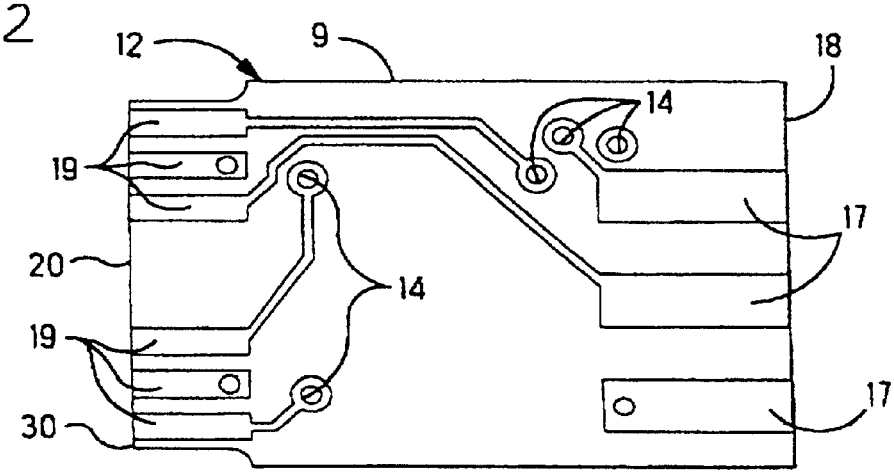
FIG. 22 is a bottom view of a bottom layer of the circuit board as shown in FIG. 20.

The circuit board 4 is of multi-layer circuit board construction, comprising: a flat insulating substrate 9 having an upper layer 10, a central layer 11 and a bottom layer 12 (see FIGS. 20–22). The central layer 11 is separated from the other layers 10, 12 by insulating material of the substrate 9.

The central layer 11 comprises, a conducting ground plane 13, referenced to electrical ground, with plating lined apertures 14 (also known as vias) extending through the central layer 11. These plating lined apertures 14 extend through the upper layer 10 and the bottom layer 12. In the apertures 14, the plating establishes electrical connections on the upper layer 10 and the lower layer 12 to the ground plane 13. Signal conditioning circuitry 7 on the upper layer 10 is in the form of multiple conducting pads 15, of square shape, and multiple relatively narrow circuit paths 16 interconnecting various conducting pads 15 and various plating lined apertures 14. Each of the pads 15 is identified with an impedance symbol, R or L or C to indicate electrical elements that provide signal conditioning, which satisfies requirements of industry technical standard documents, ANSI X3TI 1/FC-0, ANSI X3TII specification and ANSI X3T10.1 for a High Speed Serial Data Connector. The elements vary with cable construction, data rate and length of the cable assembly 1, and have the following typical values:

R1=75 Ohm R7=37 Ohm

R2=75 Ohm R8=75 Ohm

R3=150 Ohm L1=390 nH

R4=75 Ohm C1=33 pF

R5=37 Ohm C2=33 pF

R6=150 Ohm

The elements can be constructed of discrete or individual circuit elements, not shown, that are attached to the pads by a soldering operation. Alternatively, the impedances can be of planar microstrip construction fabricated by known microstrip making processes.

The upper layer 10 of the signal conditioning circuitry 7 further comprises, an array of three conducting pads 17 along an edge 18 of the circuit board 4 for connection to respective electrical contacts 3.

The lower or bottom layer 12 of the signal conditioning circuitry 7 comprises, an array of three conducting pads 17 along the edge 18 of the circuit board 4 for connection to respective electrical contacts 3, an array of six conducting pads 19 along another edge 20 of the circuit board 4 for connection to respective cable conductors 5, and electrical circuit paths 16 interconnecting various pads 19 and plating lined apertures 14. The cable conductors 5 can extend from separate electrical cables or can extend together from a single electrical cable 6 as shown (see FIG. 3).

Figure 13:
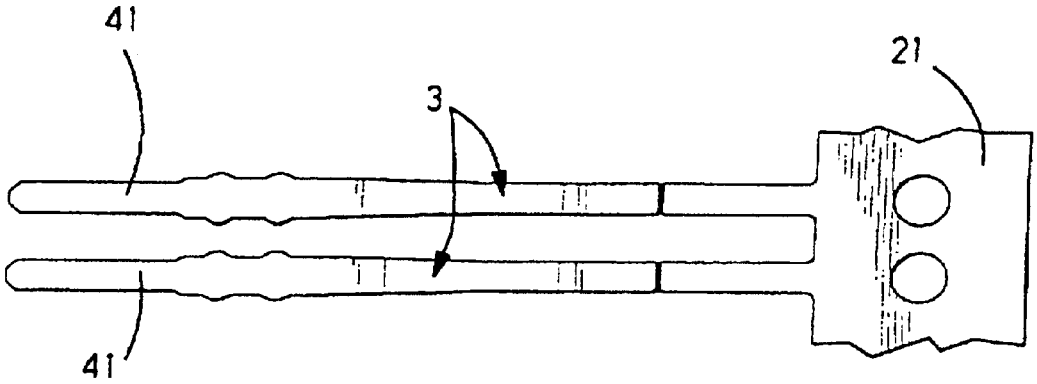
FIG. 13 is atop view of electrical contacts on a removable carrier strip.
Figure 14:
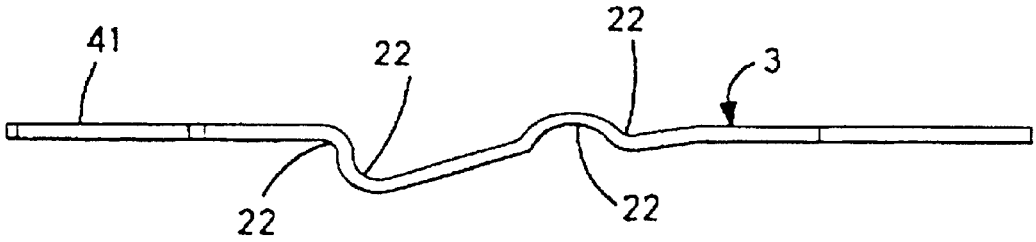
FIG. 14 is an edgewise view of one of the contacts as shown in FIG. 13.
Figure 15:
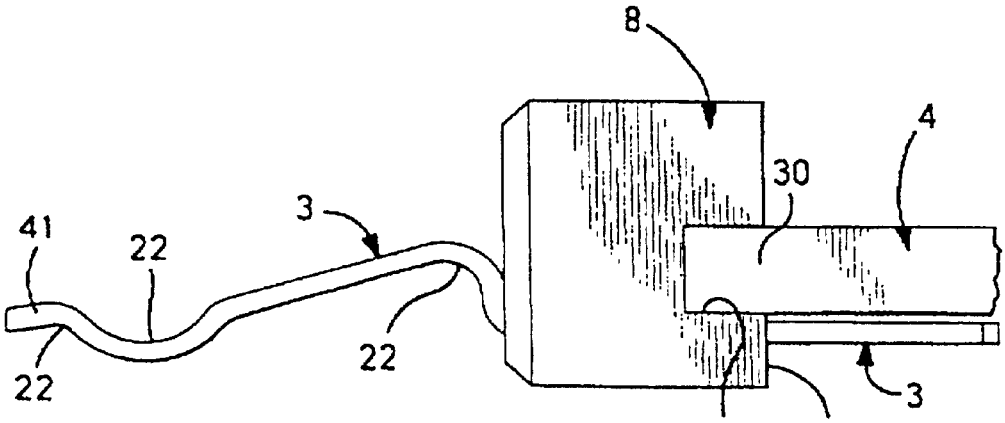
FIG. 15 is a view similar to FIG. 14 and illustrating a holder in combination with multiple contacts as shown in FIG. 13.

Each of the electrical contacts 3 has a construction as shown (see FIGS. 13–15). Each contact 3 is stamped and formed from a strip of metal having a plane of thickness. Each contact 3 extends from a carrier strip 21, and is subsequently severed from the carrier strip 21. A side view (see FIG. 14) shows a plane of thickness of the contact 3 edgewise, with various bends 22 along the length of the contact 3.

An insulating holder 8 is of unitary molded construction. Projecting, tapered latch fingers 23 project from exterior ends 24 of the holder 8 (see FIGS. 9–10). A row of spaced apart passages 25 extend through a front end 26 and a rear end 27 of the holder 8 (see FIGS. 9–11). A recess 29 in the rear end 27 intercepts each of the passages 25. The passages 25 extend beside the recess 29 and communicate with the recess 29.

Each of the contacts 3 fits with a friction fit in any one of the passages 25. When the contacts 3 are mounted in respective passages 25, the contacts 3 extend through the holder 8 from front end 26 to the rear end 27. The contacts 3 project into the recess 29.

A front edge 30 of the circuit board 4 is received in the recess 29 with a friction fit (see FIG. 15). The holder 8 aligns respective contacts 3 with corresponding pads along the front edge. The rear ends of the contacts 3 project beyond the rear end of the holder 8 and overlie corresponding pads that also project beyond the rear end of the holder 8. Both the contacts 3 and the pads are exposed for visible inspection, and to effect joining of the contacts 3 with the pads. The contacts 3 can be joined to the overlaid pads by solder. For example, the pads can be coated with solder that has solidified prior to being overlaid by the contacts 3. The solder can be reflowed by the application of heat to join the contacts 3 and the pads. The joined pads and contacts 3 can be inspected visually for defective solder joints. The circuit board 4 is further held by the holder 8 for joining cable conductors 5 to the pads on the holder 8. As shown in FIG. 3 cable conductors 5 extend from one cable 6, or, alternatively, multiple cables, to respective pads 17 on both sides of the circuit board 4. The cable conductors 5 are joined by solder to the pads 19.

Figure 4:
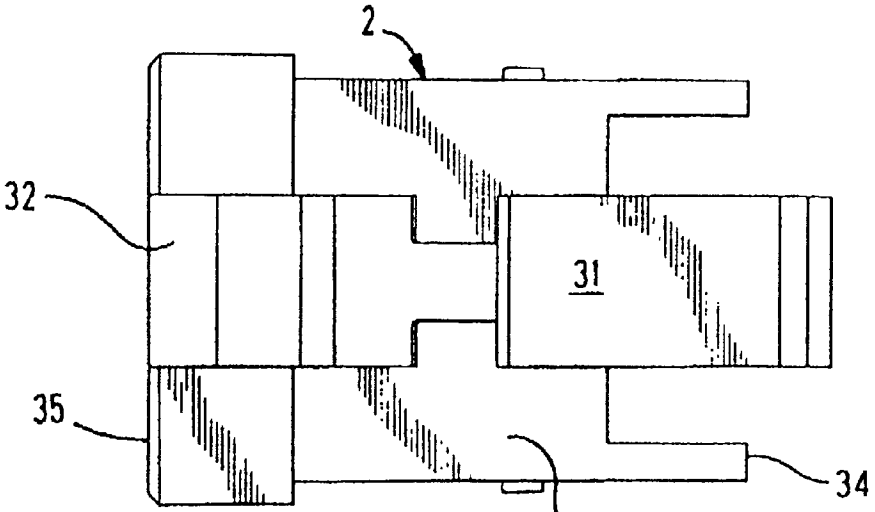
FIG. 4 is a top view of a housing comprising a portion of the cable assembly shown in FIG. 1.
Figure 5:
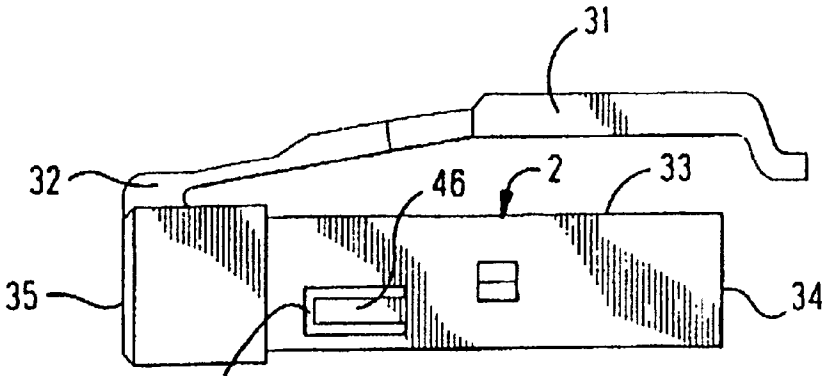
FIG. 5 is a side view of the housing as shown in FIG. 4.
Figure 8:
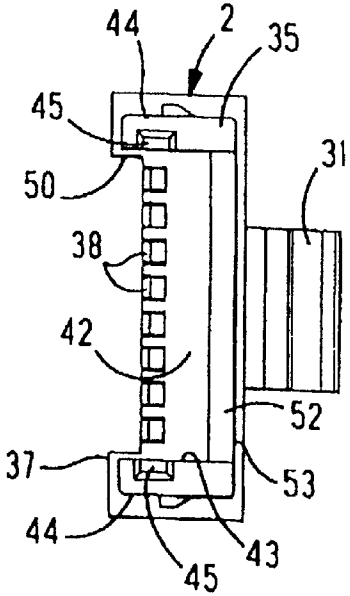
FIG. 8 is an end view of the housing as shown in FIG. 7.
Figure 7:
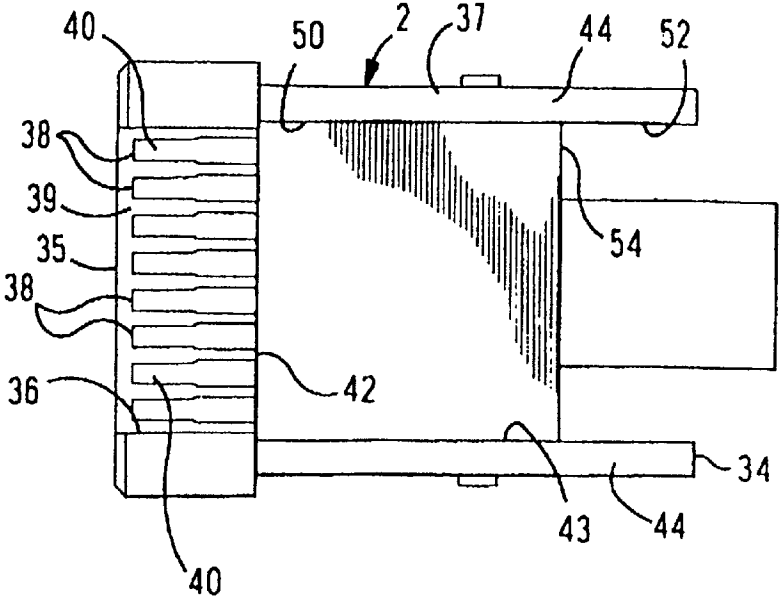
FIG. 7 is a bottom view of the housing as shown in FIG. 4.
Figure 6:
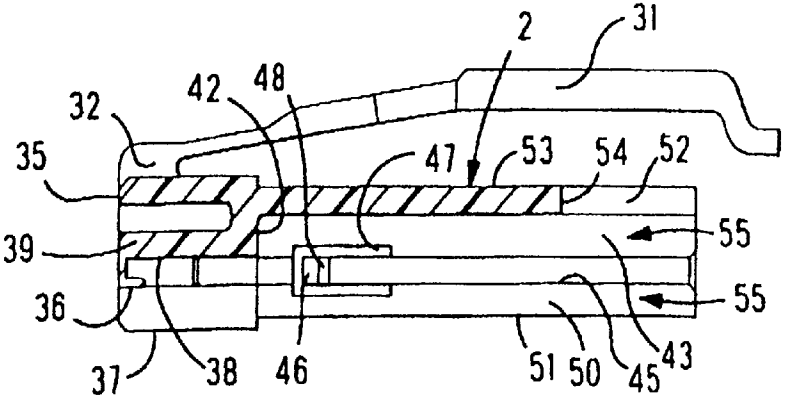
FIG. 6 is a side view partially in section of the housing as shown in FIG. 5.
Figure 11:
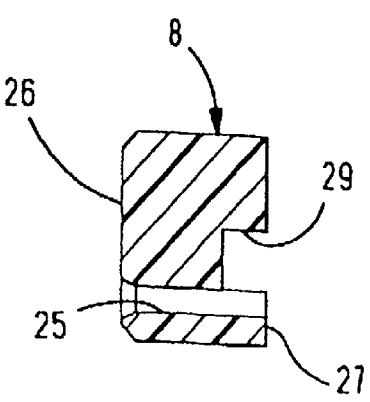
FIG. 11 is a section view of the holder as shown in FIG. 10.
Figure 12:
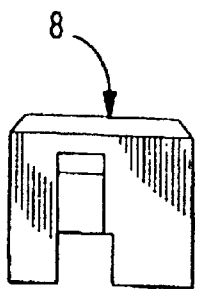
FIG. 12 is an end view of the holder as shown in FIG. 9.
Figure 9:
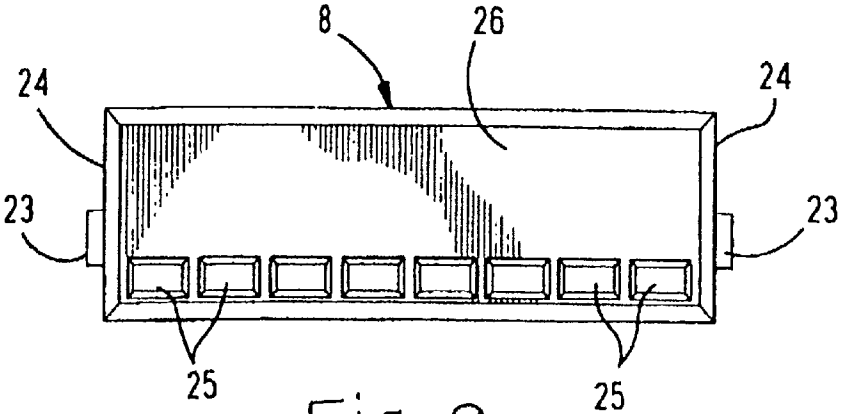
FIG. 9 is a front view of a holder comprising a portion of the cable assembly as shown in FIG. 1.
Figure 10:
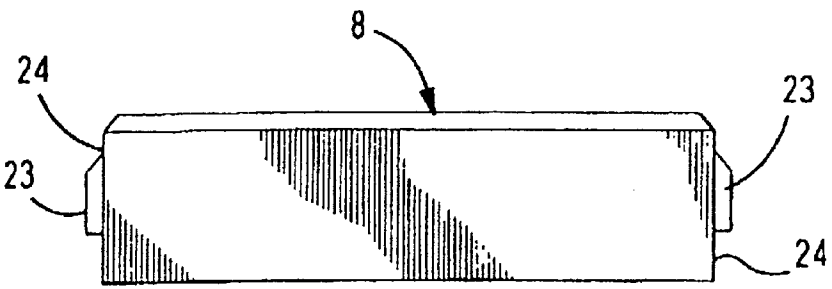
FIG. 10 is a top view of the holder as shown in FIG. 9.

The housing 2 is of unitary construction, molded from an insulating material. A latch arm 31 is a cantilever beam joined at a front end 32 to a top side 33 of the housing 2 (see FIGS. 4–5). The latch arm 31 extends at an outward incline from the front end 32 toward the rear 34 of the housing 2. A front mating end 35 of the housing 2 has an opening 36 that opens laterally to a bottom side 37 of the housing 2 (see FIG. 6). Laterally beside the opening 36 a row of contact receiving channels 38 extend recessed along a tongue 39 on the housing 2. The channels 38 have narrower front portions 40 to receive the narrower tips 41 of the contacts 3 (see FIGS. 7 and 14). The opening 36 fully exposes the channels 38 through the bottom side 37, which enables inspection of the contacts 3 for proper registration along the channels 38. This advantage is particularly important when the contacts 3 have narrow tips 41 that are susceptible to damage.

In the interior of the housing 2, the channels 38 extend through a front wall 42 of a cavity 43. The cavity 43 has a width that extends across all of the channels 38. The width extends to opposite sides 44 of the housing 2. Circuit board receiving grooves 45 are recessed in the sides 44 of the housing 2, the grooves 45 opening into the cavity 43. Resiliently deflectable latch fingers 46 project into the cavity 43 and intercept the grooves 45. Each latch finger 46 is integral with a remainder of the housing 2. Each latch finger 46 is constructed by a slit 47 through the housing 2 along three sides of the finger 46, which defines the flange 46 as a resilient cantilever beam. A ramped projection 48 on each tip of the latch fingers 46 projects into the corresponding groove 45.

The grooves 45 and the cavity 43 extend through a rear 34 of the housing 2. A first window 50 provides an open bottom side 37 of the housing 2. The window 50 spans the width of the cavity 43 and communicates with the opening 36. The opening 36 exposes the interior of the housing 2 when the housing 2 is viewed from the bottom side 51. The opening 36 exposes the lengths of the channels 38 when the housing 2 is viewed from the bottom side 51. The first window 50 extends from the front wall 42 of the cavity 43 to the rear 49 of the housing 2. A second window 52 provides an open top side 53 of the housing 2. The second window 52 spans the width of the cavity 43, and extends through the rear 49 of the housing 2 and extends forwardly to an end wall 54. The second window 52 is shorter front to rear than the first window 50.

Assembly of the housing 2 with the circuit board 4, the holder 8 and the contacts 3 will now be described. The contacts 3 and the circuit board 4 have been mounted to the holder 8, as described herein. The contacts 3 project forwardly of the holder 8 and are aligned with corresponding channels 38, as the holder 8 is inserted into the rear of the housing 2. The projecting latch fingers 23 on the holder 8 are aligned with the grooves 45. The holder 8 is moved forwardly relative to the housing 2. The latch fingers 23 on the holder 8 slide forwardly along the grooves 45 to deflect outwardly that latch fingers 46 on the housing 2. Once the latch fingers 23 on the holder 8 pass the deflected latch fingers 46 on the housing 2, the latch fingers 46 on the housing 2 deflect resiliently and return to their prior positions, whereby they lock against the latch fingers 23 on the holder 8 to resist rearward movement of the holder 8. The front end 26 on the holder 8 faces the front wall 42 on the housing 2 to resist movement farther forward. The contacts 3 are moved forwardly into and along respective channels 38. The connections of the contacts 3 and the cable conductors 5 with the circuit board 4 are visible for inspection through the respective windows 50, 52. The conductive pads 17, 19 on the circuit board 4 face respective open sides of the housing 2. The contacts 3 and the conductors 5 of the cable 6 overlie respective conductive pads 17, 19 and are viewed through the open sides for registration of the contacts 3 with the pads 17, and for registration of the cable conductors 5. The circuit board 4 has its edges held in the grooves 45.

The circuit board 4 is held centrally in the housing 2 with spacious air gaps 55 on both sides of the circuit board 4. The air gaps 55 are sufficient to prevent electrical shorting to the unprotected circuit board 4 that is exposed by the windows 50, 52. A conductive shield 56 comprised of two, sheet metal shells 57, 57 that cover the windows 50, 52 and encircle the housing 2. Further details of the shield 56 and the shells 57, 57 are disclosed in U.S. patent application Ser. No. 08/008, 926, Filed Jan. 26, 1993, incorporated herein by reference. The shells 57,57 are identical, and extend rearwardly beyond the rear 49 of the housing 2. Channels 59 on a rear of both shells 57,57 encircle and enclose on an electrical cable 6, providing a strain relief 60 that grips the cable 6. The application of a tensile force on the cable 6 will be absorbed by the strain relief 60 to prevent a transfer of tensile force onto the connections of the cable conductors 5 and the circuit board 4.

An insulating overmold 61 covers the shield 56 and the cable 6. The overmold 61 is molded in situ to cover a rear of the shield 56 and to encircle the cable 6 and provide a bending strain relief 58.

An advantage of the invention resides in a cable assembly 1 having a housing 2 that is constructed for alignment of a circuit board 4 relative to electrical contacts 3 and multiple cable conductors 5, which improves the time expended for performing connection of signal conditioning circuitry 7 with the contacts 3 and the cable conductors 5.

What is claimed is:

[1. An electrical cable assembly comprising: multiple conductors of an electrical cable connected to circuitry on a circuit board, multiple electrical contacts in registration with respective conductive pads of the circuitry, an insulating holder holding the circuit board and the electrical contacts, an insulating housing receiving therein the holder and the electrical contacts and the circuit board, a window providing an open side of the housing, the contacts and the pads being exposed through the open side for inspection of the registration of the contacts with the pads.]

[2. An electrical cable assembly as recited in claim 1, and further comprising: a conductive shield encircling the housing and covering the window.]

[3. An electrical cable assembly as recited in claim 2 wherein, a strain relief on the shield grips the cable.]

[4. An electrical cable assembly as recited in claim 1, and further comprising: another window providing a second open side of the housing, the cable conductors and the circuitry being exposed through the second open side for inspection of connections of the cable conductors with the circuitry.]

[5. An electrical cable assembly as recited in claim 4, and further comprising: a conductive shield encircling the housing and covering both the window and said another window.]

[6. An electrical cable assembly as recited in claim 5 wherein, a strain relief on the shield grips the cable.]

[7. An electrical cable assembly as recited in claim 1 wherein, tips of the contacts project from the holder and extend into the housing.]

[8. An electrical cable assembly comprising: multiple electrical contacts and multiple conductors of an electrical cable connected to respective conductive pads of circuitry on a circuit board, an insulating holder holding the circuit board and the electrical contacts, an insulating housing receiving therein the holder and the electrical contacts, the circuit board being held in the housing, and windows in open sides of the housing exposing for inspection the contacts and the conductors overlying respective conductive pads of the circuitry.]

[9. An electrical cable assembly as recited in claim 8 wherein, the holder and the contacts and the circuit board are received along a cavity that extends to a rear of the housing, and the holder and the housing latch together to resist rearward movement of the holder.]

[10. An electrical cable assembly as recited in claim 8, and further comprising: a conductive shield encircling the housing and covering the windows.]

[11. An electrical cable assembly as recited in claim 8 wherein, tips of the contacts project from the holder and extend into the housing.]

[12. An electrical cable assembly comprising: multiple electrical contacts and multiple conductors of an electrical cable connected to respective conductive pads of circuitry on a circuit board, an insulating holder holding the circuit board and the electrical contacts, an insulating housing receiving therein the holder and the electrical contacts, the circuit board being held in the housing, a window providing an open side of the housing, the cable conductors and the circuitry being exposed through the open side for inspection of connections of the cable conductors with the circuitry.]

[13. An electrical cable assembly as recited in claim 12, and further comprising: a conductive shield encircling the housing and covering the window.]

[14. An electrical cable assembly as recited in claim 12 wherein, tips of the contacts project from the holder and extend into the housing.]

*15. A method of assembling an electrical connector assembly comprising:*

*providing a circuit board;*

*connecting electrical contacts to the circuit board;*

*providing a housing having a top side and opposite sides that define a cavity in the housing, the cavity extending between the opposite sides, the housing having a front mating end with an opening therein that opens laterally to a bottom side of the housing;*

*recessing grooves into the opposite sides of the housing with the grooves open into the cavity extending between the opposite sides, wherein the grooves and the cavity extend to a rear end of the housing; and*

*inserting a contact holder, electrical contacts and the circuit board at the rear end of the housing into the grooves and cavity until the circuit board is proximate the front mating end of the housing.*

*16. The method of claim 15, further comprising providing signal conditioning circuitry on the circuit board for conditioning high speed serial data signals carried over an electrical cable.*

*17. The method of claim 15, further comprising mounting signal conditioning circuitry on the circuit board before inserting the circuit board into the grooves.*

*18. The method of claim 15, further comprising:*

*inserting the contact holder and electrical contacts through the rear end of the housing into the grooves prior to inserting the circuit board into the housing, wherein the electrical contacts are connected to the circuit board after the circuit board is inserted into the housing.*

*19. The method of claim 15, further comprising:*

*providing conductive pads on the circuit board;*

*interconnecting the conductive pads with narrow circuit paths on the circuit board; and*

*attaching signal conditioning circuitry to at least one of the conductive pads and the circuit paths.*

*20. The method of claim 15, further comprising:*

*soldering circuit elements to the circuit board to provide signal conditioning.*

*21. The method of claim 15, further comprising mounting electrical contacts to the circuit board before inserting the circuit board into the grooves.*

*22. The method of claim 15, further comprising:*

*mounting a holder to the circuit board; and*

*mounting contacts to the holder.*

*23. The method of claim 15, further comprising providing a holder configured to be mounted to contacts and the circuit board, the holder including latch fingers; and*

*inserting the latch fingers into the grooves at the rear end of the housing before inserting the circuit board.*

*24. The method of claim 15, further comprising connecting an electrical cable to the circuit board.*

*25. A method of assembling an electrical connector assembly comprising:*

*providing a circuit board;*

*providing a housing having a top side and opposite sides that define a cavity in the housing, the cavity extending between the opposite sides, the housing having a front mating end with an opening therein that opens laterally to a bottom side of the housing;*

*recessing grooves into the opposite sides of the housing with the grooves open into the cavity extending between the opposite sides, wherein the grooves and the cavity extend to a rear end of the housing;*

*inserting the circuit board at the rear end of the housing into the grooves and cavity until the circuit board is proximate the front mating end of the housing; and*

*recessing a row of channels along a tongue on the housing, the tongue being located beside the opening in the front mating end.*

*26. The method of claim 25, further comprising providing signal conditioning circuitry on the circuit board for conditioning high speed serial data signals carried over an electrical cable.*

*27. The method of claim 25, further comprising:*

*inserting a contact holder and electrical contacts through the rear end of the housing into the grooves; and*

*connecting the electrical contacts to the circuit board.*

*28. The method of claim 25, further comprising:*

*providing conductive pads on the circuit board;*

*interconnecting the conductive pads with narrow circuit paths on the circuit board; and*

*attaching signal conditioning circuitry to at least one of the conductive pads and the circuit paths.*

*29. The method of claim 25, further comprising:*

*mounting a holder to the circuit board; and*

*mounting contacts to the holder.*

*30. The method of claim 25, further comprising providing a holder configured to be mounted to contacts and the circuit board, the holder including latch fingers; and*

*inserting the latch fingers into the grooves at the rear end of the housing before inserting the circuit board.*

*31. An electrical connector assembly, comprising:*

*a circuit board with contacts on at least one end thereof;*

*a housing having a top side and opposite sides that define a cavity in said housing, said cavity extending between said opposite sides, said housing having a front mating end with an opening therein that opens laterally to a bottom side of said housing, said opposite sides having grooves recessed therein, said grooves opening into said cavity, said grooves and cavity extending to a rear end of said housing, said circuit board being inserted into said grooves and said cavity at said rear end of said housing until said circuit board is proximate said front mating end; and*

*a holder securing said contacts to said circuit board, said holder being inserted into said grooves in said opposite sides of said housing.*

*32. The electrical connector assembly of claim 31, further comprising signal conditioning circuitry mounting on said circuit board, said signal conditioning circuitry being set to condition high speed serial data signals carried over an electrical cable.*

*33. The electrical connector assembly of claim 31, further comprising signal conditioning circuitry mounted on said circuit board.*

*34. The electrical connector assembly of claim 31, further comprising an electrical cable connected to said circuit board.*

*35. An electrical connector assembly comprising:*

*a circuit board with contacts on at least one end thereof;*

*a housing having a top side and opposite sides that define a cavity in said housing, said cavity extending between said opposite sides, said housing having a front mating end with an opening therein that opens laterally to a bottom side of said housing, said opposite sides having grooves recessed therein, said grooves opening into said cavity, said grooves and cavity extending to a rear end of said housing, said circuit board being inserted into said grooves and said cavity at said rear end of said housing until said circuit board is proximate said front mating end, and said housing having a row of channels recessed along a tongue of said housing, said tongue being located beside said opening in said front mating end.*

*36. The electrical connector assembly of claim 35, further comprising signal conditioning circuitry mounting on said circuit board, said signal conditioning circuitry being set to condition high speed serial data signals carried over an electrical cable.*

*37. The electrical connector assembly of claim 35, further comprising signal conditioning circuitry mounted on said circuit board.*

*38. The electrical connector assembly of claim 35, further comprising an electrical cable connected to said circuit board.*

*39. The electrical connector assembly of claim 35, further comprising a holder securing said contacts to said circuit board, said holder being inserted into said grooves in said opposite sides of said housing.*

* * * * *